United States Patent
Sensale-Rodriguez et al.

(10) Patent No.: US 8,836,446 B2
(45) Date of Patent: Sep. 16, 2014

(54) METHODS AND APPARATUS FOR TERAHERTZ WAVE AMPLITUDE MODULATION

(75) Inventors: Berardi Sensale-Rodriguez, South Bend, IN (US); Huili (Grace) Xing, South Bend, IN (US); Rusen Yan, Mishawaka, IN (US); Michelle M. Kelly, South Bend, IN (US); Tian Fang, Mishawaka, IN (US); Debdeep Jena, South Bend, IN (US); Lei Liu, Granger, IN (US)

(73) Assignee: University of Notre Dame du Lac, Notre Dame, IN (US)

( * ) Notice: Subject to any disclaimer, the term of this patent is extended or adjusted under 35 U.S.C. 154(b) by 0 days.

(21) Appl. No.: 13/529,934

(22) Filed: Jun. 21, 2012

(65) Prior Publication Data

US 2013/0342279 A1 Dec. 26, 2013

(51) Int. Cl.
*H03C 1/02* (2006.01)
*H03C 7/00* (2006.01)

(52) U.S. Cl.
CPC ... *H03C 1/02* (2013.01); *H03C 7/00* (2013.01)
USPC .............................................. 332/179; 257/14

(58) Field of Classification Search
USPC ........................................... 332/179; 257/14
See application file for complete search history.

(56) References Cited

U.S. PATENT DOCUMENTS

2007/0194297 A1* 8/2007 McCarthy et al. .............. 257/14

* cited by examiner

*Primary Examiner* — Joseph Chang
(74) *Attorney, Agent, or Firm* — Greenberg Truarig, LLP (57) ABSTRACT

A wave amplitude modulator for modulating a transmitted electromagnetic wave includes one or multiple self-gated capacitively coupled pair(s) of electron layers such as semiconductor or semimetal layers. Two electrical contacts are placed to each layer of electrons of the self-gated pair(s), and a power source is electrically connected to them. The power source, by varying the voltage applied between layers of electrons, tunes the electron density thereof, thereby adjusting the optical conductivity thereof, and the change in the optical conductivity of the layers of electrons causes an amplitude modulation of the transmitted electromagnetic wave passing through the capacitively coupled layers of electrons.

17 Claims, 7 Drawing Sheets

METHODS AND APPARATUS FOR TERAHERTZ WAVE AMPLITUDE MODULATION

GOVERNMENT LICENSING RIGHTS

This invention was made with government support under ECCS-0846910, ECCS-0802125, and ECCS-1002088 awarded by the National Science Foundation, under NIST Award No. 70NANB and H6168 awarded by the National Institute of Standards and Technology (NIST), and under N00014-09-1-0639 awarded by the Office of Naval Research. The government has certain rights in the invention.

FIELD OF THE DISCLOSURE

The present description relates generally to modulation and more particularly to methods and apparatus for radio frequency modulation.

BACKGROUND OF RELATED ART

The terahertz (THz) electromagnetic spectrum has oftentimes been recognized as an important region for scientific research. However, due to the lack of devices, circuits and systems for effective THz signal generation, detection, and modulation, this region remains at least one of the least explored and developed of the electromagnetic spectrum. The past decade witnessed an increase in THz research activities. Electrically tunable THz modulation is one of the actively pursued subjects due to its importance in applications such as communications, imaging, and spectroscopy.

In one example a THz modulator operates at room temperature by employing a semiconductor two-dimensional electron-gas (2DEG) structure. More particularly, in the example THz modulator, the modulation is achieved by controlling the electron density in a gated two-dimensional electron gas structure. For instance, reducing the electron density which leads to an increase in the transmitted intensity of an incident beam of THz radiation. By depleting an electron gas of density $10^{12}$ cm$^{-2}$, the example THz modulator achieved a maximum modulation depth of approximately 3% of the THz electric field, or equivalently 6% modulation depth of the THz intensity, for a pulse of terahertz radiation covering the range of frequencies from 0.1 to 2 THz. Though room-temperature operation is an advance compared to previous devices that required operation at cryogenic temperatures, the intensity modulation depth (MD) of approximately 6% is oftentimes insufficient for practical use.

Consequently, one example of room-temperature THz modulator research has trended towards metamaterial approaches. For example, U.S. Pat. No. 7,826,504 describes a metamaterial structure for the modulation of terahertz frequency signals. In the described device, each element within an array of metamaterial elements comprises multiple loops and at least one gap. The metamaterial elements include resonators with conductive loops and insulated gaps, or the inverse in which insulated loops are present with conductive gaps; each providing useful transmissive control properties. The metamaterial elements are fabricated on a semiconducting substrate configured with a means of enhancing or depleting electrons from near the gaps of the metamaterial elements. A described on to off transmissivity ratio of about 0.5 is purportedly achieved with the example device described. It will be appreciated, however, that these metamaterial-based devices have several comparative disadvantages. For example, known metamaterial-based devices are intrinsically narrowband and usually have a polarization-dependent response.

Accordingly, while the previous devices generally work for their intended purposes, there is an identifiable need for an improved terahertz wave amplitude modulator as presently disclosed.

DETAILED DESCRIPTION

The following description of example methods and apparatus is not intended to limit the scope of the description to the precise form or forms detailed herein. Instead the following description is intended to be illustrative so that others may follow its teachings.

In the present disclosure, there is described a device wherein the modulation depth of greater than approximately ninety percent (90%) is achievable. Specifically, as will be described herein, by employing graphene or any other suitable self-gated 2DEG material, to form self-gated capacitively coupled layers of electrons, in place of the previously utilized metal gate the modulation depth of the THz modulator may be greatly increased. The term 2DEG material as used herein includes semiconductor (semimetal) structures whose optical thickness is smaller than the wavelength of the electromagnetic wave it modulates. In at least one example, the disclosed methods and apparatus therefore comprise a self-gated, capacitively coupled pair of tunable layers of electrons.

Figure 1:
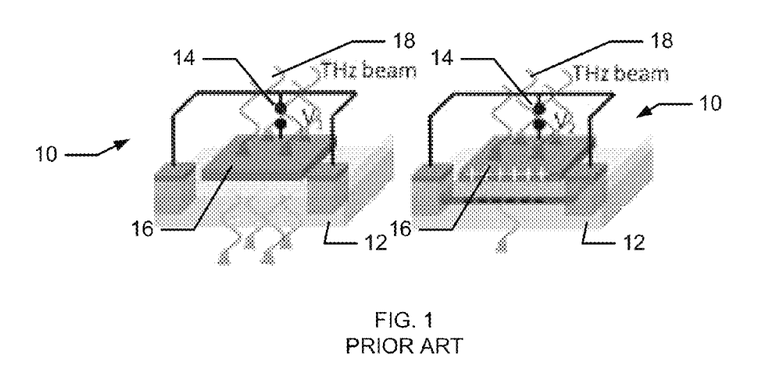
FIG. 1 is an example prior art THZ modulator device.

Referring now to FIG. 1, there is illustrated an example prior art THZ modulator device 10. In this example, the device 10 is a generic two-dimensional electron-gas (2DEG)-based electrically driven THz modulator. The device 10 comprises a conductive 2DEG media 12 tunable by a voltage 14 applied between a top metal gate 16 and the 2DEG media 12. In this example, transmission of a THz beam 18 is high with low 2DEG densities and low with high 2DEG densities due to enhanced absorption and reflection. Because THz transmission through the conducting media 12 is a function of its conductivity, modulation of the THz beam 18 can be achieved by electrically tuning the density of the 2DEG media 12 using the metal gate 16.

It is also known by one of ordinary skill in the art, however, that previously proposed, complex metamaterial based modulators may enhance modulation depth, but such gains are at the expense of being narrowband and oftentimes polarization dependent. The modulation depth of the 2DEG based THz modulators fabricated using metal-gated semiconductors is unavoidably limited to be small by the adverse effect of the gate metal.

In the present disclosure, a THz modulator includes graphene, a natural two dimensional material with a symmetric band structure and exhibiting the highest tunable sheet conductivity, for a modulation depth larger than approximately 90% reachable by tuning the Fermi level in a single layer graphene over a broad range of carrier frequencies up to a few THz. The example graphene layer is capacitively coupled with another layer of electrons: a two dimensional hole gas (2DHG) which accumulates in the interface of a $SiO_2$/Si substrate in which the graphene lies on.

Figure 2A:
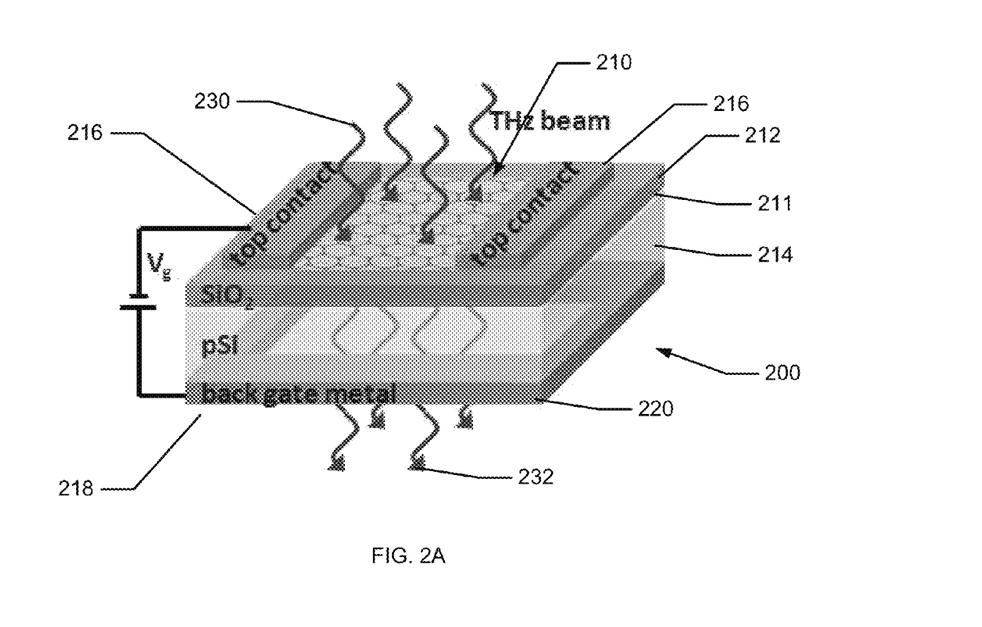
FIG. 2A is an example graphene-based THz modulator constructed in accordance with the teachings of the present disclosure.

More specifically, referring to FIG. 2A, an example graphene-based THz modulator 200 is disclosed. The illustrated modulator 200 includes two self-gated 2DEG layers. In this example one of the 2DEG layers is a two-dimensional semi-metal or zero-gap semiconductor layer, such as, for example, a graphene layer 210. In this example, the graphene layer 210 is formed on a conducting media or substrate, which in this example includes an insulator, such as a dielectric material including a silicon dioxide ($SiO_2$) layer 212, and a semiconductor or dielectric material substrate p-type silicon (p-Si) 214. The other layer of electrons is accumulated in the $SiO_2$/Si interface 211 and comprises, for example, a 2DHG. The modulator 200 further includes at least one contact 216 electrically coupled to the graphene layer 210 and a contact 218 electrically coupled to the substrate and thus to the 2DHG. In at least some example, the modulator 200 may also include a ring gate 220. A power supply 222 is electrically coupled to the contacts 216, 218 to provide a voltage between the contacts.

In the illustrated example, the modulator 200 shown in FIG. 2A comprises a single-layer graphene 210 of about 2×2 $cm^2$ formed on a $SiO_2$/p-Si substrate 212, 214 with two top contacts 216 to graphene and one bottom ring gate contact 218, 220. The example p-type Si substrate 214 includes a doping concentration of $\sim 1 \times 10^{15}$ $cm^{-3}$. The instant p-type SI substrate 214 was selected to facilitate THz direction detection by avoiding severe attenuation of THz beams in a highly conductive substrate. The example top contacts 216 are utilized to monitor the conductivity of the graphene layer 210, while the example gate 220 is used to tune the charge concentration in the two self-gated 2DEG layers, and thus control the density of charge in the graphene layer 210. In operation, a THz beam 230, such as for example in the frequency band of approximately 570 to 630 GHz, passing through the example device 200 may be amplitude modulated to form a modified THz beam 232 by tuning self-gated 2DEG layers. In at least one example described below, the example THz modulator 200 is capable of operating at approximately 300 K (26.85 C, 80.33 F), or approximately room temperature.

It will be appreciated by one of ordinary skill in the art that the example device 200 may also be constructed over existent solid state THz emitters (e.g., emitter of a carrier in the THz region), such as quantum cascade laser (QCL), resonant tunneling diode (RTD) oscillators, etc. In this example, the effect of interface reflections may be negligible and therefore, the loss inserted by the modulator may be owed solely to the minimal conductivity associated with the graphene layer 210. Thus, the example graphene device 200 may be utilized for a "single chip" THz carrier transmitter.

Still further, while the example device 200 is illustrated with a single graphene layer 210 and capacitively coupled 2DHG in the $SiO_2$/Si interface, it will be understood that these two layers of electrons may be any suitable tunable two-dimensional layer of electrons based on other materials, such as 2DEG/2DHG pairs in conventional semiconductor materials, other natural two dimensional semiconductors such as $MoS_2$ etc. Furthermore, there may be any number of layers as desired, located in any position on an insulator separating the self-gated 2DEG, such as the substrate 212, 214. For instance, the modulator 200 may include more layers 210 on the distal and/or proximate side of the substrate in relation to the THz transmitter. Additionally, while the substrate is illustrated as a pSi substrate, and the insulator separating the two capacitively coupled electron layers is $SiO_2$, any suitable substrate and/or insulator may be employed as desired.

Figure 2B:
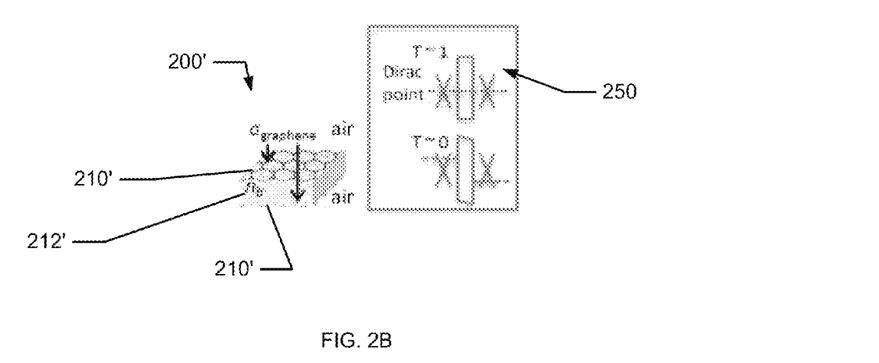
FIG. 2B is another example graphene-based THz modulator constructed in accordance with the teachings of the present disclosure.

In another example of the present disclosure, illustrated in FIG. 2B, a modulator 200' comprises a first graphene layer 210' disposed on a first surface of an insulating material 212' (e.g., $SiO_2$) and a second graphene layer 210" disposed on a second surface of the insulating material 212' opposite the first surface. Also illustrated are the schematic energy band diagrams 250 of the modulator 200' that shows near zero beam attenuation and unity modulation depth. When the Fermi level is at the Dirac point of both the top and bottom layers 210', 210", transmission of the THz electromagnetic wave approaches unity, and when electron and hole sheets of charges are formed in the top and bottom graphene layers 210', 210", THz transmission nears zero.

Figure 2C:
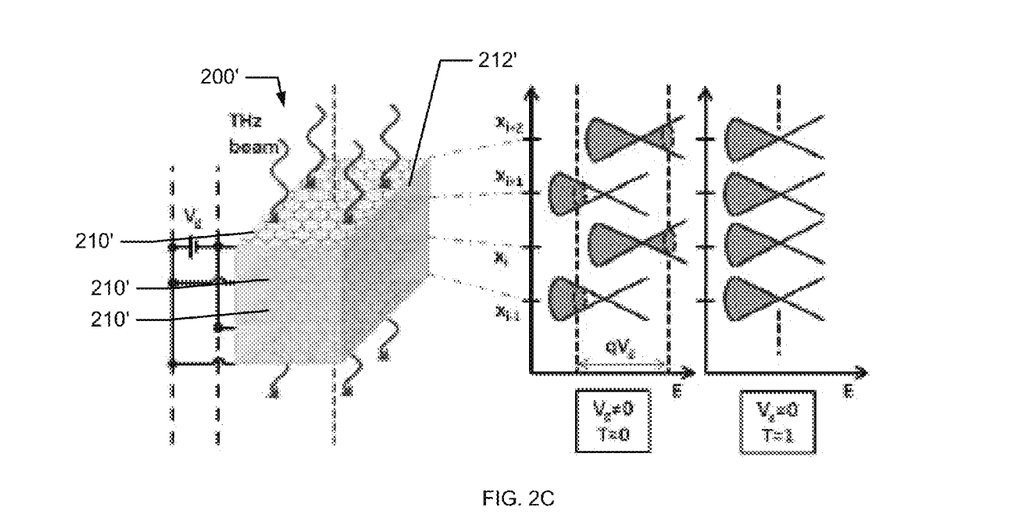
FIG. 2C is another example graphene-based THz modulator constructed in accordance with the teachings of the present disclosure.
Figure 2D:
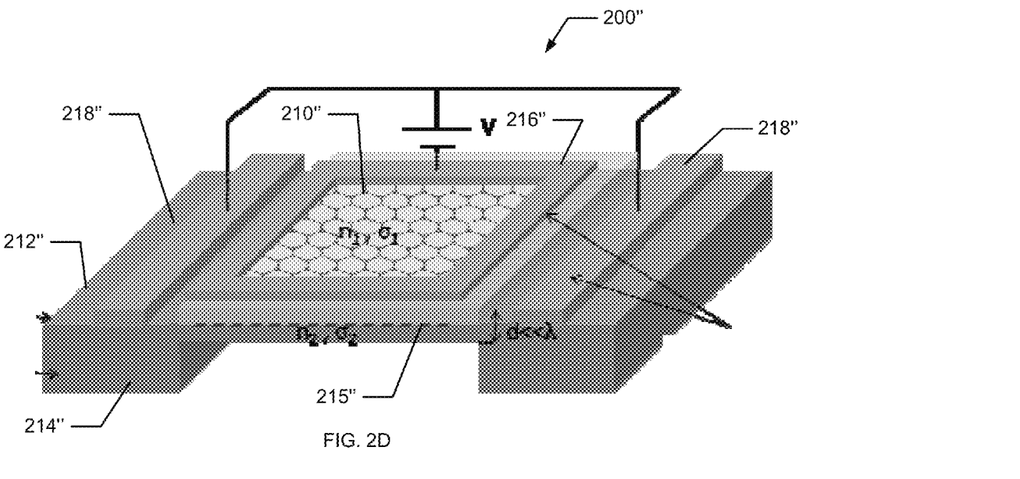
FIG. 2D is yet another example graphene-based THz modulator constructed in accordance with the teachings of the present disclosure.

In yet another example of the present disclosure, illustrated in FIG. 2D, a modulator 200" comprises a graphene layer 210"', an insulator 212", a substrate 214", with a region forming a membrane 215", and contacts 216" and 218" electrically coupled to a power supply. The example contacts 218" connect to the bottom layer of electrons (e.g., through the substrate 214" and may be, for example, a ring. Still further, in this instance, the thickness of the insulator 212" and the membrane 215" is much smaller that the wavelength of the THz beam (not shown).

In the illustrated example, the modulator 200" may form two (or multiple as shown in FIG. 2C) self gated capacitively coupled layers of electrons over a thin membrane 210"'. In particular, as with the previous example, by applying a voltage between these two layers the carrier concentrations (n1) and (n2) are tuned thus their conductivity, therefore THz transmittance. The modulator is constructed over a thin membrane, such that both the thickness of the insulator 212" between the two layers of electrons, and the thickness of the membrane 210"', are much smaller than the THz wavelength. This allows the ability of the modulator 200" to suppress substrate cavity effects. Substrates with low refractive index are preferred to suppress reflections and other substrates cavity effects. In still another example, addition, the self-gated capacitively coupled layers of electrons might be "suspended" by structurally supporting the layers by the thin insulator 212" between without the benefit of the substrate 214". In the illustrated example, n2 and σ2 are the concentration and conductivity of the second layer of electrons, respectively. In the illustrated example, this layer might be a 2DEG at the interface between the insulator 212" and the membrane 215" interface, but it may also be, for example, a second graphene layer.

Figure 3:
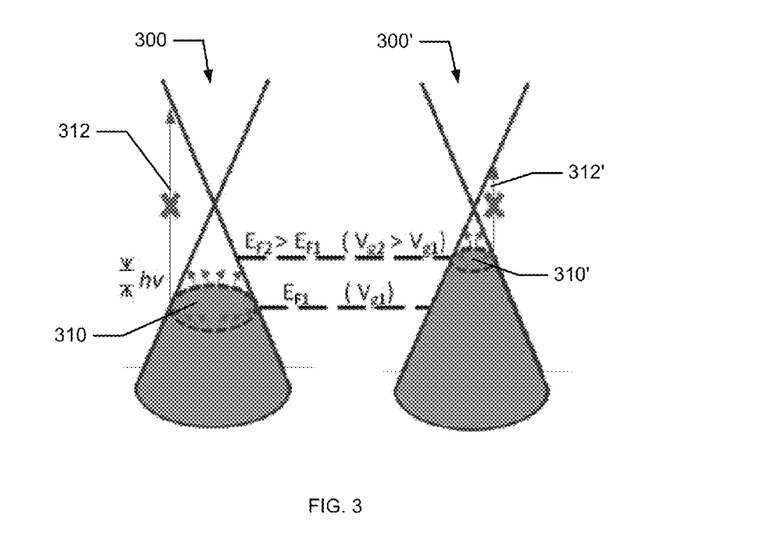
FIG. 3 is an example of the operating principle of the example THz modulator of FIG. 2A.

Referring to FIG. 3 an example of the operating principle of the example device 200 is shown. In the illustrated example showing the conical band structure 300 and the optical processes in graphene, an intraband transition, shown by arrows 310 dominates under the THz illumination where the photon energy is generally smaller than 12.4 meV (3 THz). When tuning the Fermi level in graphene, the density of states available for intraband transitions can be tuned, thus the THz transmission can be tuned. Traditional interband transition, shown by arrows 312 from valence to conduction band dominates in the IR/visible range, but not in the THz range. A similar phenomenon can be seen in the conical band structure 300' which also includes intraband transition 310' versus interband transition 312'. As further illustrated, the Fermi level (E) and the voltage (V) associated with structure 300 is smaller than the Fermi level, and voltage associated with the structure 300', thus the density of states available for intraband transitions in structure 300 is larger than that in structure 300'.

As noted, the example layer 210 comprises graphene, a two-dimensional semiconductor with zero bandgap and electron transport properties. Based on their peculiar band structures, single-layer graphene and multilayer graphene may be utilized for the disclosed example device 300. Graphene supports an exceptionally high achievable carrier concentration ($\sim 1 \times 10^{14}$ cm$^{-2}$) as well as exceptional carrier mobility (>20,000 cm$^2$/Vs for $n_s \sim 5 \times 10^{12}$ cm$^{-2}$), which leads to a large voltage tunable conductivity range comparable to conventional epitaxial semiconductor structures. Optical absorption in graphene involves two processes: carrier intra-band transition and inter-band transition as illustrated in FIG. 3. This transition can be expressed using its optical conductivity, wherein $\sigma(\omega)$ is $\sigma_{intra}(\omega) + \sigma_{inter}(\omega)$ where ω is the angular frequency of the photon. Transmission can be modulated between nearly zero and unity by a single layer graphene over a broad range of carrier frequencies up to a few terahertz, which is in sharp contrast with its absorption of approximately 2.3% in the infrared/visible range. Additionally, extremely low signal attenuation at room temperature induced by the intrinsic device (e.g., less than about 0.2 dB per graphene layer) can be realized by taking advantage of its reasonably low minimum conductivity when he Fermi level is tuned at its Dirac point. When employing substrates with low refractive indices and/or small optical thicknesses, signal attenuation due to air/substrate reflections and cavity effects can be controlled to be <0.5 dB, for instance, in a suspended graphene modulator with a total thickness of <10 μm.

Calculations of optical conductivity have shown that for short wavelengths (i.e. infrared (IR) and visible range) the graphene optical conductivity is determined by inter-band transitions, while for long wavelengths (i.e. THz range) it is dominated by intra-band transitions as shown in FIG. 3. In the IR and visible range where inter-band transitions dominate, the graphene optical conductivity is nearly independent of the Fermi energy in graphene ($E_F$) and the optical frequency (hv) as long as hv>2$E_F$; a classical value of optical conductivity $\sigma(\omega) = e^2/4$ h gives rise to a constant absorption of 2.3% by a single-layer graphene. On the other hand, in the THz range where intra-band transitions dominate, graphene behaves like a conductive film, and its optical conductivity closely follows its electrical conductivity. Optical conductivity can be described by a simple Drude model of the form $\sigma(\omega) = \sigma_{DC}(E_F)/(1+\omega^2\tau^2)$, where $\sigma_{DC}(E_F)$ represents the DC electrical conductivity and τ is the carrier momentum scattering time. As such, THz absorption in graphene can be modulated by tuning its electrical conductivity or Fermi level; when $\omega\tau \ll 1$, $\sigma(\omega) \sim \sigma_{DC}(E_F)$; when $\omega\tau > 1$, $\sigma(\omega) < \sigma_{DC}(E_F)$.

As disclosed, the active device may comprise one or multiple capacitively coupled graphene-semiconductor, graphene-graphene, or semiconductor-semiconductor pairs so that holes are induced in one layer while electrons are induced in the second layer. At zero bias, the Fermi level is at the Dirac point of all graphene layers thus introducing minimum insertion loss or signal attenuation. When a bias is applied, 2-dimensional hole gases (2DHGs) are induced in the graphene layers connected to the positive power supply and 2-dimensional electron gases (2DEGs) in the other graphene layers connected to the negative power supply. Besides facile integration with other material platforms, another unique advantage of graphene over the conventional semiconductors lies in its excellent hole transport properties. Because hole and electron mobilities and their density of states are the same due to the graphene symmetric band structure, each graphene layer can contribute equally to terahertz modulation. The stacked structure can help overcome the potentially limited modulation in a single graphene layer realizable in experiments.

Figure 4:
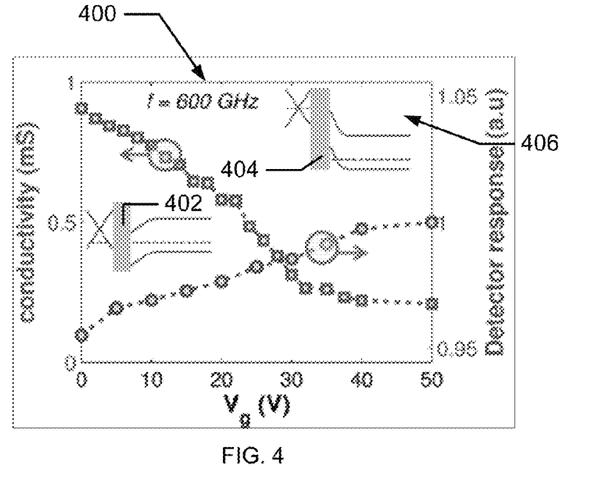
FIG. 4 is an example plot of the measured transmittance at 600 GHz and the conductivity of the example semiconductor layer of the device of FIG. 2A as a function of the back gate voltage.

Referring now to FIG. 4, there is shown a plot 400 of the measured transmittance at 600 GHz and the graphene DC conductivity as a function of the back gate voltage from 0 to 50 V. As illustrated, the transmittance increases with decreasing DC electrical conductivity. In the example plot 400, as will be appreciated, the graphene layer 210 is p-type in the entire range of the gate voltage swing because its minimum conductivity or Dirac point occurs at Vg≥50 V. Insets 402, 404 show the energy band diagrams of the example graphene/SiO$_2$/p-Si device 200. At zero volts (0 V), the Fermi level $E_F$ in graphene is ~380 meV below the Dirac point and p-Si substrate is under depletion. At fifty volts (50 V), the Fermi level $E_F$ in graphene is near the Dirac point and a 2D hole gas in Si accumulates near the SiO$_2$/Si interface.

Figure 5:
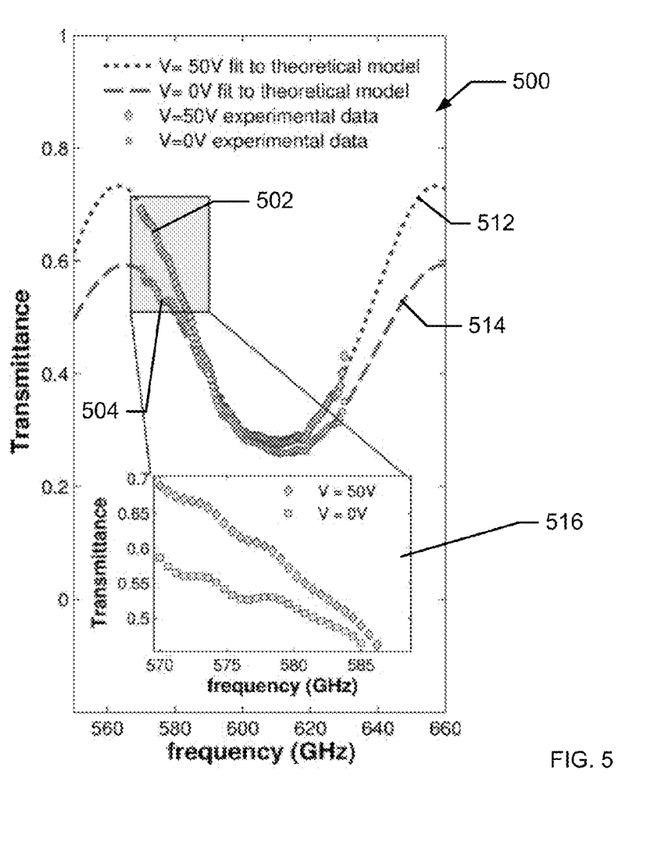
FIG. 5 is an example plot that shows measured results of the transmittance versus frequency of the example device of FIG. 2A.

FIG. 5 illustrates an example plot 500 that shows measured results 502, 504 of the transmittance after filtering out the standing waves between the THz source and the sample. Also shown in FIG. 5 are simulated transmittance curves 512, 514 using Si substrate with a thickness of 480 μm and a constant bulk conductivity of 40 mS/cm, and graphene conductivity of 0.9 mS and 0.2 mS at zero volts (0 V) and fifty volts (50 V), respectively. The excellent agreement between the measured results 502, 504 and simulated results 512, 514 using experimentally determined parameters illustrates that THz transmission in graphene indeed is described by the aforementioned Drude model in this frequency range. Furthermore, as will discuss, the Si substrate 212, 214 does not play a significant role in the observed THz transmission modulation. It is worth noting that there is a small phase shift, which most likely stems from the simplified assumptions adopted in the model. The maximum transmittance change was measured to be 15±2% at 570 GHz, which is significantly higher than the reported value of 6% observed in previously utilized AlGaAs/GaAs 2DEG, while approaching the demonstrated 30% to 80% in complex meta-material based THz modulators, which are intrinsically narrowband. The maximum transmittance change is significant as the example device 200 comprises only a single-layer of graphene 210, thus indicating that multiple tunable layers of electrons, such as graphene and/or graphene pairs may be used as desired.

In FIG. 5, the measured results 502, 504 and the modeled results 512, 514 illustrate the transmittance as a function of frequency for back gate voltages of 0 and 50 V. An inset 516 shows the close-up of the transmittance results near 570 GHz showing that a maximum modulation of 15±2% is achieved at 570 GHz.

Figure 6:
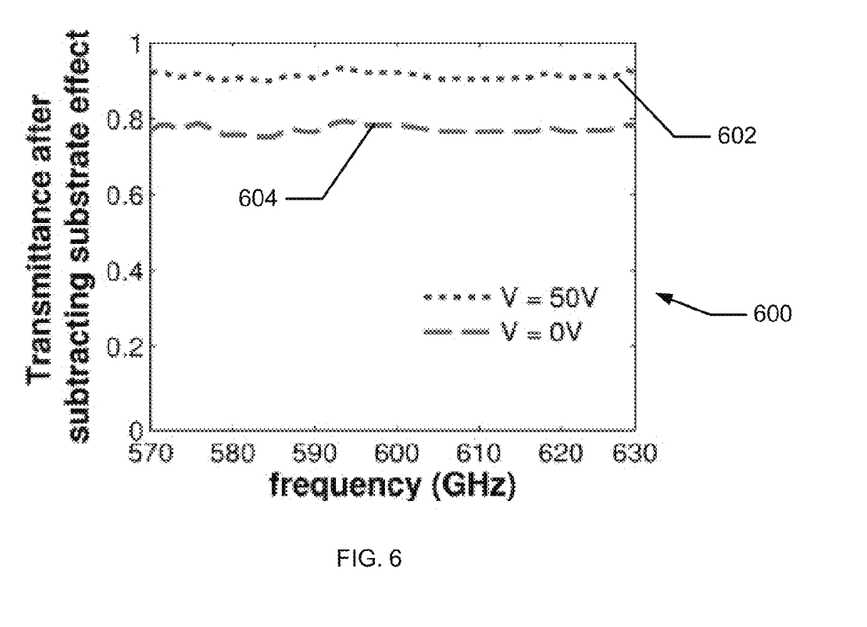
FIG. 6 is an example plot that presents the extracted transmittance of the example graphene semiconductor layer after subtracting oscillations due to the substrate and the voltage-independent attenuation in the bulk p-Si substrate of the example device of FIG. 2A.

Turning to FIG. 6, there is illustrated a plot 600 that presents the extracted transmittance of graphene after subtracting oscillations due to the substrate and the voltage-independent attenuation in the bulk p-Si substrate. The plot 600 includes a plot 602 at 50 V and a plot 604 at 0 V. The plot 602 demonstrates approximately 93% at 50 V and the plot 604 indicates approximately 78% at 0 V, which corresponds to a tuned absorption of THz beam by single-layer graphene from ~5% to ~20%. The calculated reflectance/absorption and transmittance versus graphene optical conductivity plots 602, 604 are shown with the substrate effects removed. It is interesting to note that the minimum conductivity of graphene does not introduce appreciable THz attenuation: absorption <0.05 and reflection ~0, assuming a minimum conductance of 4 $e^2/h$. An appreciable and nearly constant modulation over the frequency range is observed in the actively tuned graphene. The excellent match between the simulation and the experimental results using the DC graphene conductivity also suggests that the carrier scattering time in graphene $\tau$<250 fs since $\sigma(\omega)=\sigma_{DC}(E_F)/(1+\omega^2\tau^2)\sim\sigma_{DC}(E_F)$. The modulation efficiency in graphene will decrease with increasing frequency of the THz beam.

It will be appreciated by one of ordinary skill in the art that with improved preparation of graphene leading to better uniformity and higher carrier mobility, the THz modulation depth is expected to increase; however, the carrier scattering time limited modulation bandwidth will decrease.

Still further, it is noted that for broadband operation, it is oftentimes desirable to eliminate the strong cavity effect by shrinking the cavity dimension along the transmission direction (substrate thickness) to be a small fraction of the THz beam wavelength. The present example device shows a cavity-limited 3 dB bandwidth of 9 THz can be potentially achieved in a graphene/10-nm-$Al_2O_3$/1-μm Si device. This extraordinarily high modulation depth by a single layer graphene 210 under normal incidence offers a simple solution to realize attenuators, modulators, and potentially detectors for THz systems. On the contrary, for known IR modulation using graphene it is necessary to adopt the waveguide platform due its small absorption of 2.3%.

Figure 7A:
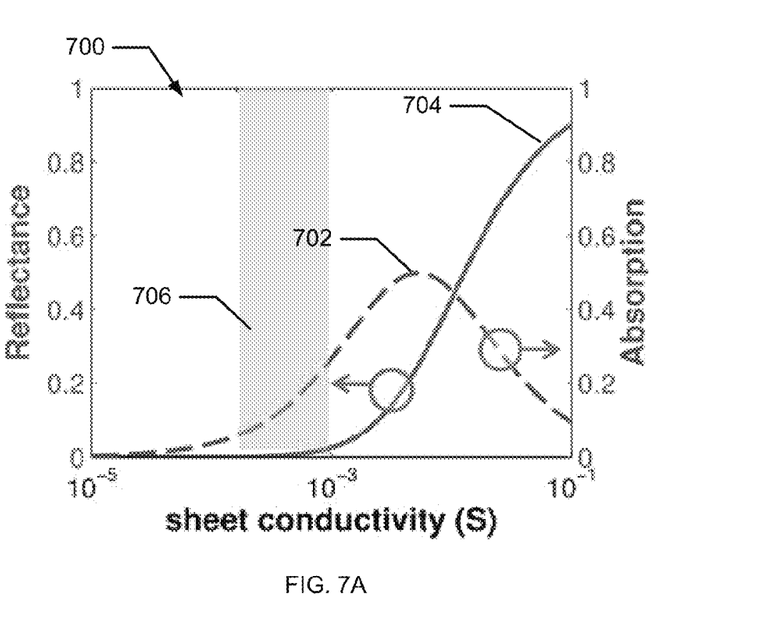
FIGS. 7A and 7B illustrate an example simulated plot of absorption, reflectance, transmittance, and tunability as a function of graphene optical conductivity.
Figure 7B:
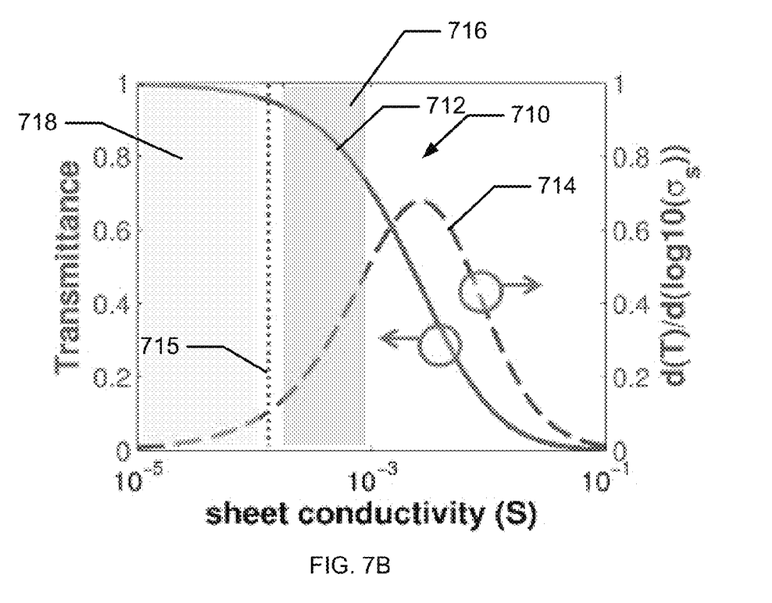

FIGS. 7A and 7B each illustrate a simulated plot of absorption, reflectance, transmittance, and tunability as a function of graphene optical conductivity. Specifically, FIG. 7A illustrates a plot 700 of a simulated absorption 702 and a reflectance 704 as a function of graphene optical conductivity. A shaded region 706 of the plot 700 indicates the range of graphene DC conductivity observed in this study. FIG. 7B, meanwhile, illustrates a plot 710 of a simulated transmittance as a function of graphene optical conductivity 712 and an associated transmission tunability 714. Also shown on the plot 710 are a typical minimum DC conductivity of graphene (4$e^2/h$~0.15 mS) 715, a range of graphene DC conductivity observed in this experimental study 716, and a range of Si 2D hole gas DC conductivity 718.

Figure 8A:
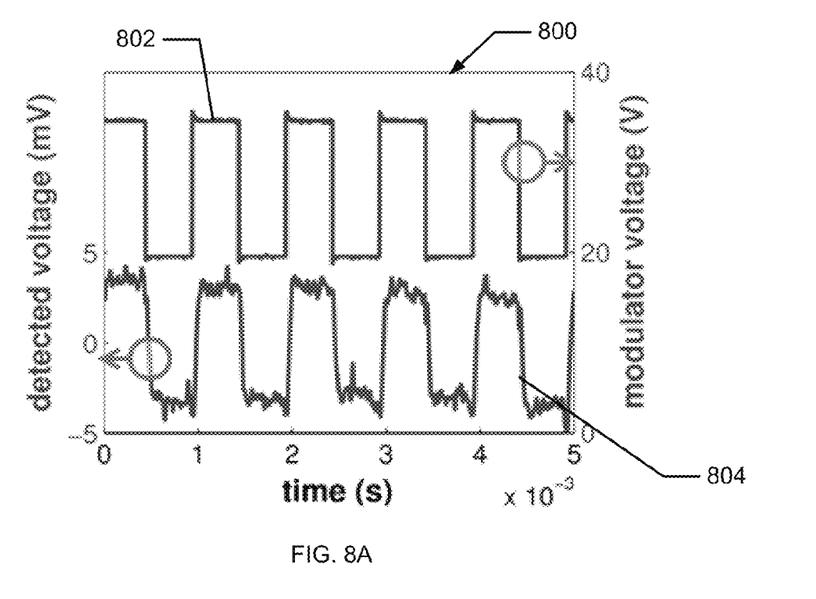
FIG. 8A illustrates an example plot showing a square wave drive voltage and a modulated THz beam signal at a detector for a carrier frequency of approximately 570 GHz.
Figure 8B:
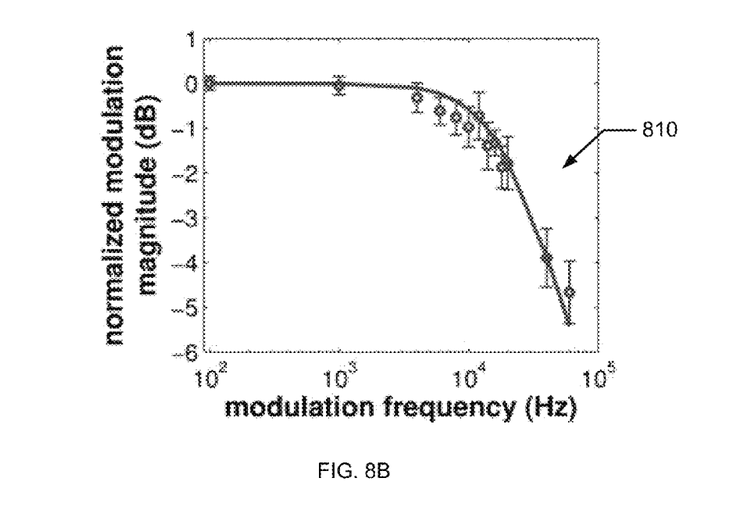
FIG. 8B illustrates an example plot of a normalized modulation magnitude, showing a 3 dB operation bandwidth of ~20 kHz.
Figure 8C:
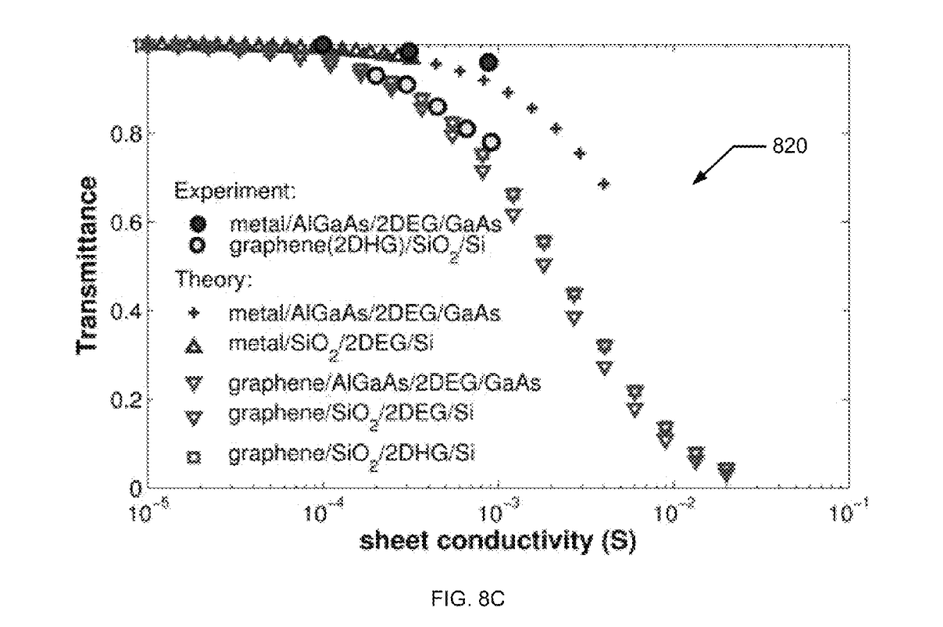
FIG. 8C illustrates an example plot of a predicted and an experimentally observed transmittance in various 2DEG-based THz modulation devices.

The modulation speed of the example device 200 was also measured and the results are shown in FIGS. 8A-8C. For instance, FIG. 8A illustrates a plot 800 showing a square wave drive voltage 802 and a modulated THz beam signal 804 at a detector for a carrier frequency of approximately 570 GHz. FIG. 8B illustrates a plot 810 of a normalized modulation magnitude, showing a 3 dB operation bandwidth of ~20 kHz. It will be appreciated that the bandwidth is limited by the parasitic RC response of the device. The plot 810 predicts that a modulation frequency of up to about 200 MHz for 3 THz carrier is expected by reducing the device dimensions.

FIG. 8C illustrates a plot 820 of a predicted and experimentally observed transmittance in various 2DEG-based THz modulation devices. Due to the adverse influence of the metal gate, modulation of THz transmission by tuning the 2DEG conductivity is severely reduced. On the other hand, the example device 200 including a single-layer graphene 210 as an active layer instead of a gate metal dramatically enhances this modulation. In the theoretical calculation illustrated in the plot 820, an attenuation of 0.9 due to the metal gate and semi-insulating substrate were assumed; the Fermi level in graphene was set at the Dirac point at the threshold voltage of 2DEG formation in AlGaAs/GaAs or $SiO_2$/Si heterostructures. The maximal conductivity was calculated based on the best reported values for each material at 300 K.

More particularly, as illustrated in FIGS. 8A-8C, from the response waveform to a square modulation voltage, the 10-90% rise time is found to be 38 μs; thus, the 3 dB bandwidth is calculated to be fc ~18 kHz. This result matches well with the directly measured 3 dB bandwidth of 20 kHz, which is found to be limited by the RC constant of the device. As a result, by reducing the device size from approximately 1.4× 1.4 $cm^2$ in this study to a dimension comparable to the THz carrier beam wavelength, high modulation speed can be achieved. For instance the modulation speed may be about 2 MHz for a device of approximately 1.5×1.5 $mm^2$ (0.3 THz carrier) or about 200 MHz for a device of approximately 0.15×0.15 $mm^2$ (3 THz carrier). This speed achievement represents one of the highest known speeds for known broadband THz modulation devices.

Although certain example methods and apparatus have been described herein, the scope of coverage of this patent is not limited thereto. For example, while the present disclosure describes a device that may be tested in the 570 to 630 GHz frequency band, it will be understood by one of ordinary skill in the art that the present disclosure may be equally applied to any other suitable frequency range, from near DC to far-IR. Still further, it will be understood by one of ordinary skill in the art that terahertz radiation generally comprises electromagnetic waves propagating at frequencies in the terahertz range, from 0.1 to 3 THz. The term typically applies to electromagnetic radiation with frequencies between high-frequency edge of the microwave band, 100 gigahertz ($1\times10^{11}$ Hz), and the long-wavelength edge of far-infrared light, 30 THz ($3\times10^{12}$ Hz). This patent covers all methods, apparatus, and articles of manufacture fairly falling within the scope of the appended claims either literally or under the doctrine of equivalents.

We claim:

1. A wave amplitude modulator for modulating a transmitted electromagnetic wave, the modulator comprising:
   a substrate;
   a first tunable two-dimensional electron-gas layer disposed on the substrate;
   an insulator material disposed on the tunable two-dimensional electron-gas layer;
   a graphene layer configured as a second tunable two-dimensional electron-gas material disposed on the insulator material; and a power source electrically coupled to both the first and second two-dimensional electron-gas layers, wherein the power supply provides a voltage between the first and second two-dimensional electron-gas layers, wherein the applied voltage tunes the electron concentration of the two-dimensional electron-gas layers by inducing the formation of holes in one of the two-dimensional electron-gas layers, while inducing the formation of corresponding electrons in the other of the two-dimensional electron-gas layers and thereby adjusting the optical conductivity thereof, and wherein the change in the optical conductivity causes a modulation of the transmitted wave passing through the modulator.

2. A modulator as defined in claim 1, wherein the first tunable two-dimensional electron-gas material is a graphene layer.

3. A modulator as defined in claim 1, wherein the transmitted wave is a terahertz wave.

4. A modulator as defined in claim 1, wherein the thickness of the substrate, the insulator, the first tunable two-dimensional electron-gas layer, and the grapheme layer combined are smaller than the wavelength of the transmitted electromagnetic wave.

5. A modulator as defined in claim 1, wherein the insulator material further comprises a dielectric material, and wherein the substrate comprises at least one of a semiconductor or dielectric material.

6. A modulator as defined in claim 5, wherein the dielectric material is silicon dioxide layer ($SiO_2$) and wherein the substrate is at least one of a p-type silicon (p-Si) or quartz.

7. A modulator as defined in claim 1, wherein the power supply provide a variable voltage.

8. A modulator as defined in claim 1, further comprising at least two contacts electrically coupled to the power supply and the first and second two-dimensional electron-gas layers.

9. A system for modulating the amplitude of an electromagnetic wave comprising:
an emitter for emitting an electromagnetic wave; and
a modulator for receiving the emitted electromagnetic wave and allowing transmission of an electromagnetic wave, the modulator comprising:
a substrate;
a first tunable two-dimensional electron-gas layer disposed on the substrate;
an insulator material disposed on the tunable two-dimensional electron-gas layer;
a graphene layer configured as a second tunable two-dimensional electron-gas material disposed on the insulator material; and
a power source electrically coupled to both the first and second two-dimensional electron-gas layers,
wherein the power supply provides a voltage between the first and second two-dimensional electron-gas layers, wherein the applied voltage tunes the electron concentration of the two-dimensional electron-gas layers by inducing the formation of holes in one of the two-dimensional electron-gas layers, while inducing the formation of corresponding electrons in the other of two-dimensional electron-gas layers and thereby adjusting the optical conductivity thereof, and wherein the change in the optical conductivity causes an amplitude modulation of the transmitted wave passing through the modulator.

10. A system as define in claim 9, wherein the first two-dimensional electron-gas material is a graphene layer.

11. A system as defined in claim 9, wherein the emitted electromagnetic wave is a terahertz radiation.

12. A system as defined in claim 9, wherein the insulator material further comprises a dielectric material, and wherein the substrate comprises at least one of a semiconductor or dielectric material.

13. A system as defined in claim 9, wherein the dielectric material is silicon dioxide layer ($SiO_2$) and wherein the substrate is at least one of a p-type silicon (p-Si) or quartz.

14. A system as defined in claim 9, further comprising at least two contacts electrically coupled to the power supply and the first and second two-dimensional electron-gas layers.

15. A system as defined in claim 9, wherein the modulator is located over the emitter.

16. A method of modulating an electromagnetic wave comprising:
receiving an electromagnetic wave in a modulator device;
passing the received electromagnetic wave through a self-gated two-dimensional electron gas material, the self-gated two-dimensional electron gas material comprising a first graphene layer disposed on one side of an insulator, and a second graphene layer disposed on an opposite side of the insulator;
varying an electrical voltage applied between the self-gated two-dimensional electron gas material and the substrate to cause the formation of two self-gated capacitively coupled layers of electrons, which induce the formation of holes in one of the graphene layers, while inducing the formation of corresponding electrons in the other of the graphene layers and
wherein the power source tunes the concentration of the layers of electrons by applying a varying voltage, thereby adjusting the optical conductivity thereof,
wherein varying the optical conductively causes amplitude modulation of the received electromagnetic wave passing through the modulator device; and
transmitting the modulated electromagnetic wave.

17. A method as defined in claim 16, wherein the electromagnetic wave is a terahertz radiation.

* * * * *